United States Patent
Higashi et al.

(10) Patent No.: US 11,978,998 B2
(45) Date of Patent: May 7, 2024

(54) SUBSTRATE FOR MOUNTING A LIGHT-EMITTING ELEMENT, ARRAY SUBSTRATE, AND LIGHT-EMITTING DEVICE

(71) Applicant: KYOCERA Corporation, Kyoto (JP)

(72) Inventors: Toshifumi Higashi, Kirishima (JP);
Youji Furukubo, Kirishima (JP);
Sentarou Yamamoto, Kagoshima (JP)

(73) Assignee: KYOCERA CORPORATION, Kyoto (JP)

( * ) Notice: Subject to any disclaimer, the term of this patent is extended or adjusted under 35 U.S.C. 154(b) by 581 days.

(21) Appl. No.: 17/279,116

(22) PCT Filed: Sep. 18, 2019

(86) PCT No.: PCT/JP2019/036516
§ 371 (c)(1),
(2) Date: Mar. 24, 2021

(87) PCT Pub. No.: WO2020/066780
PCT Pub. Date: Apr. 2, 2020

(65) Prior Publication Data
US 2021/0399520 A1 Dec. 23, 2021

(30) Foreign Application Priority Data
Sep. 28, 2018 (JP) .................. 2018-185838

(51) Int. Cl.
*H01S 5/02315* (2021.01)
*H01S 5/022* (2021.01)
*H01S 5/40* (2006.01)

(52) U.S. Cl.
CPC .......... *H01S 5/02315* (2021.01); *H01S 5/022* (2013.01); *H01S 5/4031* (2013.01)

(58) Field of Classification Search
CPC ....... H01S 5/023–02326; H01S 5/2257; H01S 5/02253; H01S 5/02315; H01S 5/022; H01S 5/4031; H01S 5/02218; H01S 5/0225; H01S 5/02476; H01S 5/02208; H01S 5/02469; H01L 33/483–486; H01L 33/58;
(Continued)

(56) References Cited

U.S. PATENT DOCUMENTS

2009/0161712 A1* 6/2009 Hayami ................ G11B 7/123
372/44.01

FOREIGN PATENT DOCUMENTS

| JP | 2009-277833 A | 11/2009 | |
| WO | WO-2019102956 A1 * | 5/2019 | ............. H01L 33/20 |
| WO | WO-2019208437 A1 * | 10/2019 | |

* cited by examiner

*Primary Examiner* — Xinning(Tom) Niu
(74) *Attorney, Agent, or Firm* — Volpe Koenig

(57) ABSTRACT

A substrate for mounting a light-emitting element includes a base and a dam part. The base includes a front surface and a back surface that are principal surfaces thereof where the front surface includes a mounting part that is capable of mounting a light-emitting element thereon. The dam part is arranged on a peripheral part of the front surface to surround the mounting part. The front surface is inclined relative to the back surface at a predetermined angle. The dam part is provided with an opening part at a site where the front surface is inclined to decrease a thickness of the base, in the peripheral part of the front surface. A site of the dam part where the opening part is provided is inclined relative to the back surface in a direction of the front surface.

7 Claims, 9 Drawing Sheets

(58) Field of Classification Search
CPC .. H01L 33/62; G02B 6/24; G02B 6/42; G02B 6/4296; G02B 6/4201
See application file for complete search history.

SUBSTRATE FOR MOUNTING A LIGHT-EMITTING ELEMENT, ARRAY SUBSTRATE, AND LIGHT-EMITTING DEVICE

CROSS-REFERENCE TO RELATED APPLICATIONS

This application is a national stage application of International Application No. PCT/JP2019/036516, filed on Sep. 18, 2019, which designates the United States, the entire contents of which are herein incorporated by reference, and which is based upon and claims the benefit of priority to Japanese Patent Application No. 2018-185838, filed on Sep. 28, 2018, the entire contents of which are herein incorporated by reference.

FIELD

A disclosed embodiment(s) relate(s) to a substrate for mounting a light-emitting element, an array substrate, and a light-emitting device.

BACKGROUND

A light-emitting device has conventionally been known for introducing laser light to an optical waveguide that is formed on a substrate (see, for example, Patent Literature 1).

CITATION LIST

Patent Literature

Patent Literature 1: Japanese Patent Application Publication No. 2009-277833

SUMMARY

A substrate for mounting a light-emitting element according to an aspect of an embodiment includes a base and a dam part. The base has a front surface and a back surface that are principal surfaces thereof where the front surface has a mounting part that is capable of mounting a light-emitting element thereon, and the dam part is arranged on a peripheral part of the front surface to surround the mounting part. The front surface is inclined relative to the back surface at a predetermined angle. The dam part is provided with an opening part at a site where the front surface is inclined to decrease a thickness of the base, in the peripheral part of the front surface. A site of the dam part where the opening part is provided is inclined relative to the back surface in a direction that is identical to that of the front surface.

Furthermore, an array substrate according to an aspect of an embodiment is provided in such a manner that a plurality of the substrates for mounting a light-emitting element as described above are joined.

Furthermore, a light-emitting device according to an aspect of an embodiment includes the substrate for mounting a light-emitting element or array substrate as described above, and a light-emitting element(s) that is/are mounted on the mounting part(s) of the substrate for mounting a light-emitting element or array substrate.

DESCRIPTION OF EMBODIMENTS

A conventional light-emitting device has room for improvement in reducing a transmission loss on a light path in a case where an optical waveguide is irradiated with light.

An aspect of an embodiment is provided by taking the above into consideration and aims to provide a substrate for mounting a light-emitting element, an array substrate, and a light-emitting device that are capable of reducing a transmission loss on a light path in a case where an optical waveguide is irradiated with light.

Hereinafter, an embodiment(s) of a substrate for mounting a light-emitting element, an array substrate, and a light-emitting device as disclosed in the present application will be explained with reference to the accompanying drawings.

Substrate for Mounting Light-Emitting Element

Figure 1:
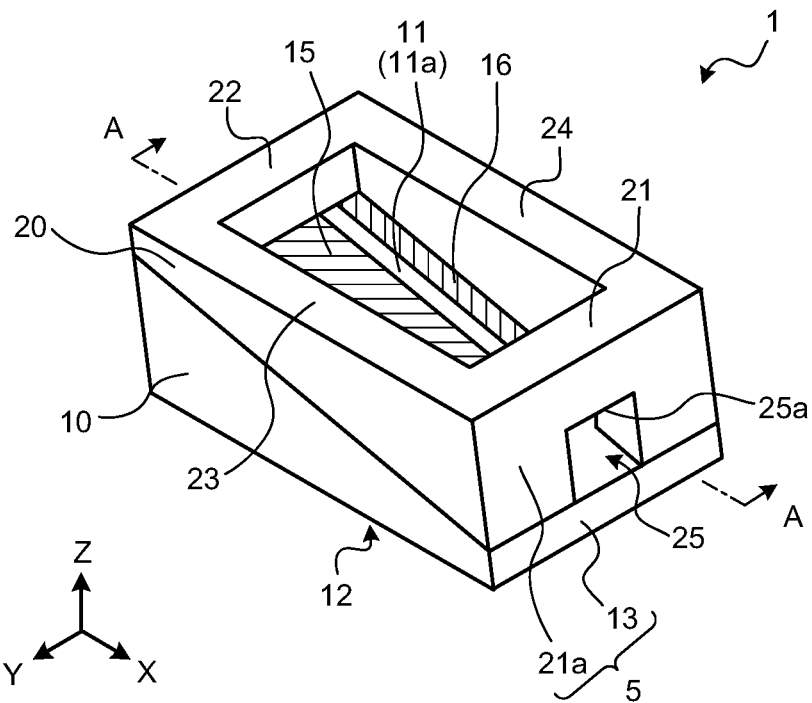
FIG. 1 is a perspective view of a substrate for mounting a light-emitting element according to an embodiment.

First, an outline of a substrate for mounting a light-emitting element 1 according to an embodiment will be explained by using FIG. 1 to FIG. 3. As illustrated in FIG. 1 or the like, the substrate for mounting a light-emitting element 1 according to an embodiment is of a rectangular shape in a plan view thereof and includes a base 10 and a dam part 20. Then, the substrate for mounting a light-emitting element 1 is integrally formed by the base 10 and the dam part 20.

The base 10 is of a rectangular shape in a plan view thereof and has a front surface 11 and a back surface 12 that are two principal surfaces thereof. Additionally, FIG. 1 and FIG. 2 illustrate a three-dimensional orthogonal coordinate system where a direction where a normal line of the back surface 12 is oriented is provided as a direction of a Z-axis, for sake of clear explanation.

The front surface 11 is inclined relative to the back surface 12. Specifically, whereas the back surface 12 is parallel to any of an X-axis and a Y-axis, the front surface 11 is inclined relative to the X-axis while it is parallel to the Y-axis. Furthermore, whereas a normal line of the back surface 12 is oriented in a positive direction of a Z-axis (or a negative direction of a Z-axis), a normal line of the front surface 11 is oriented in a positive direction of an X-axis and the positive direction of a Z-axis (or a negative direction of an X-axis and a negative direction of the Z-axis).

Figure 2:
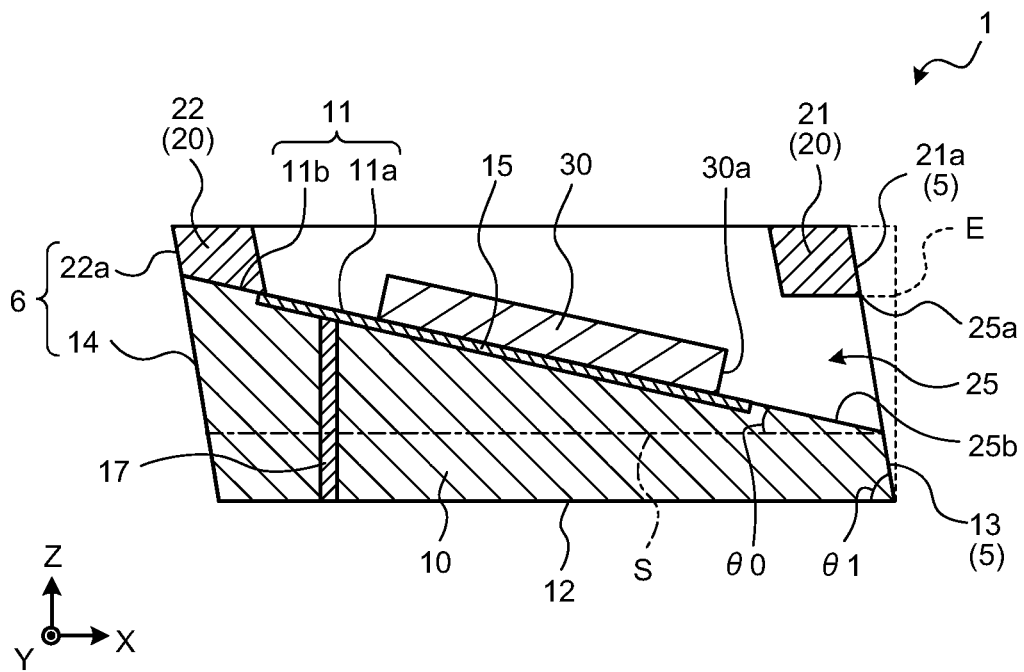
FIG. 2 is an arrow cross-sectional view along line A-A as illustrated in FIG. 1.

As illustrated in FIG. 2, the front surface 11 is inclined relative to the back surface 12 (a virtual surface S that is parallel to the back surface 12 in FIG. 2) at a predetermined angle θ0. Furthermore, the front surface 11 has a mounting part 11a that is a central region that is capable of mounting a light-emitting element 30 thereon and a peripheral part 11b that surrounds such a mounting part 11a.

The dam part 20 has a frame shape that is a rectangular shape in a plan view thereof and is arranged along the peripheral part 11b of the front surface 11. As illustrated in FIG. 1, the dam part 20 that is provided along respective sides of the base 10 has a first wall member 21 that is arranged on a side of a positive direction of an X-axis, a second wall member 22 that is arranged on a side of a negative direction of the X-axis, a third wall member 23 that is arranged on a side of a positive direction of a Y-axis, and a fourth wall member 24 that is arranged on a side of a negative direction of the Y-axis.

That is, the first wall member 21 is arranged at a site where the front surface 11 is inclined so as to decrease a thickness of the base 10, in the peripheral part 11b of the front surface 11, and the second wall member 22 is arranged at a site that is most distant from the back surface 12, in the peripheral part 11b.

An outer wall surface 21a of the first wall member 21 and a side surface 13 of the base 10 are flush, where the outer wall surface 21a of the first wall member 21 and the side surface 13 of the base 10 composes a side surface 5 of the substrate for mounting a light-emitting element 1.

In the first wall member 21, an opening part 25 is formed that penetrates therethrough between the mounting part 11a and an exterior thereof. Then, as illustrated in FIG. 2, the light-emitting element 30 is mounted on the mounting part 11a in such a manner that a light-emitting surface 30a thereof faces the opening part 25. Then, light that is radiated from the light-emitting surface 30a of the light-emitting element 30 passes through the opening part 25 and is radiated to an exterior thereof.

Herein, in the substrate for mounting a light-emitting element 1 according to an embodiment, the first wall member 21 of the dam part 20 is not perpendicular to the back surface 12 but is inclined relative thereto in a direction that is identical to that of the front surface 11. In other words, the outer wall surface 21a of the first wall member 21 is inclined relative to an X-axis while it is parallel to a Y-axis and a normal line of the outer wall surface 21a is oriented in a positive direction of the X-axis and a positive direction of a Z-axis (or a negative direction of the X-axis and a negative direction of a Z-axis), similarly to the front surface 11.

In yet other words, in a cross-sectional view along an XZ-plane as illustrated in FIG. 2, any of the front surface 11 and the outer wall surface 21a of the first wall member 21 is inclined so as to descend as proceeding in a positive direction of an X-axis. Additionally, the outer wall surface 21a is inclined relative to the back surface 12 at a predetermined angle θ1.

Thereby, it is possible to move a corner part 25a that is provided at a place that is most distant from the base 10 in the opening part 25 and contacts the outer wall surface 21a of the first wall member 21 so as to be closer to the light-emitting surface 30a of the light-emitting element 30.

That is, as compared with a corner part E of the opening part 25 in a case where the outer wall surface 21a is perpendicular to the back surface 12 as indicated by a broken line in FIG. 2, the corner part 25a in an embodiment is provided at a position that is closer to the light-emitting surface 30a of the light-emitting element 30.

Thereby, it is possible to further increase an opening angle of the opening part 25 relative to the light-emitting surface 30a, so that it is possible to decrease a proportion of light that impinges on the opening part 25 in one that is radiated from the light-emitting surface 30a.

Therefore, according to an embodiment, it is possible to reduce a transmission loss on a light path in a case where an optical waveguide is irradiated with light. In such a case, as illustrated in FIG. 3, in a case where an (non-illustrated) optical waveguide that is formed on a substrate 60 is irradiated with light from the light-emitting element 30, it is possible to increase a degree of accuracy of a refraction mode of light in such an optical waveguide, so that it is possible to decrease a transmission loss on a light path.

Furthermore, in an embodiment, it is preferable that an inner surface 25b that leads to the front surface 11, in an inner surface of the opening part 25, is flush with the front surface 11, as illustrated in FIG. 2. If the inner surface 25b of the opening part 25 is of a shape in such a manner that it is parallel to the back surface 12, a refraction part and/or a step part is/are formed between the front surface 11 and the inner surface 25b of the opening part 25.

In such a case, when light that is radiated from the light-emitting surface 30a passes through the opening part 25, radiated light is diffusely reflected from such a refraction part and/or step part, so that an efficiency of light emission of a light-emitting device is decreased.

However, in an embodiment, the inner surface 25b of the opening part 25 is flush with the back surface 12, and hence, a refraction part and/or a step part is/are absent in the opening part 25, so that light that is radiated from the light-emitting surface 30a is not diffusely reflected from such a refraction part and/or a step part. Therefore, according to an embodiment, it is possible to maintain a high efficiency of light emission in a light-emitting device.

Additionally, it is preferable that an inner surface that faces the inner surface 25b (that is, an inner surface that contacts the corner part 25a) in the opening part 25 is provided at an angle between an angle that is substantially parallel to that of the inner surface 25b and an angle that is substantially parallel to that of the back surface 12. That is, it does not have to be parallel to any of the inner surface 25b and the back surface 12.

Furthermore, in an embodiment, it is preferable that a height of the first wall member 21 is greater than that of the second wall member 22, as illustrated in FIG. 2 or the like. Thereby, it is possible to increase a space between an upper end surface of the first wall member 21 and the front surface 11 of the base 10, so that it is possible to form the opening part 25 so as to be large.

Therefore, according to an embodiment, even if a surface area of the light-emitting surface 30a of the light-emitting element 30 is increased, radiated light does not readily impinge on the first wall member 21, so that it is possible to increase an efficiency of light emission of a light-emitting device.

Next, a detailed configuration of the substrate for mounting a light-emitting element 1 will be explained with reference to FIG. 1 to FIG. 3.

The base 10 and the dam part 20 are formed of a ceramic(s). For such a ceramic(s), for example, alumina, silica, mullite, cordierite, forsterite, aluminum nitride, silicon nitride, silicon carbide, a glass ceramic(s), or the like is/are suitable. Then, it is preferable that the base 10 and the dam part 20 include aluminum nitride (AlN) as a main component in that a thermal conductivity is high and a thermal expansion coefficient is close to that of the light-emitting element 30.

Herein, to "include aluminum nitride as a main component" refers to the base 10 and the dam part 20 that include 80% by mass or more of aluminum nitride. In a case where aluminum nitride that is included in the base 10 and the dam part 20 is of 80% by mass or more, a thermal conductivity of the substrate for mounting a light-emitting element 1 is high, so that it is possible to improve a heat dissipation property thereof.

Moreover, it is preferable that the base 10 and the dam part 20 include 90% by mass or more of aluminum nitride. As a content of aluminum nitride is 90% by mass or greater, it is possible to provide a thermal conductivity of the base 10 and the dam part 20 as being 150 W/mK or greater, so that it is possible to realize the substrate for mounting a light-emitting element 1 with an excellent heat dissipation property.

In the substrate for mounting a light-emitting element 1 according to an embodiment, the base 10 and the dam part 20 are integrally formed of a ceramic(s). That is, in the substrate for mounting a light-emitting element 1, an interface that is composed of different kinds of materials and causes a high thermal resistance is not provided between the base 10 and the dam part 20.

Thereby, it is possible to decrease a thermal resistance between the base 10 and the dam part 20, so that it is possible to transfer heat from the base 10 to the dam part 20 efficiently. Therefore, it is possible to realize the substrate for mounting a light-emitting element 1 with a high heat dissipation property.

As illustrated in FIG. 1, the front surface 11 of the base 10 is provided with terminals for element 15, 16 that are composed of a metal. Herein, to "be composed of a metal" means that, for example, a ceramic(s) other than a metal may be included partially, and a similar meaning is also provided below.

The terminals for element 15, 16 are formed on at least the mounting part 11*a* of the front surface 11. The terminal for element 15 is a terminal where the light-emitting element 30 is mounted. The terminal for element 16 is a terminal where the light-emitting element 30 that is mounted on the terminal for element 15 is connected by a bonding wire or the like.

It is sufficient that the terminals for element 15, 16 are formed by a metallized film where a metal powder is sintered. It is possible to bond such a metallized film to a surface of a ceramic(s) that compose(s) the base 10 at a high strength, so that it is possible to realize the substrate for mounting a light-emitting element 1 with a high reliability.

Furthermore, a plated film of Ni or the like may be formed on a surface of such a metallized film. Moreover, solder or an Au—Sn plated film may be provided on a surface of such a plated film.

As illustrated in FIG. 2, the terminal for element 15 is electrically connected to a via conductor 17 that is made of a metal, is formed inside the base 10, and extends on the back surface 12. Additionally, the terminal for element 16 is also electrically connected to the via conductor 17 that is made of a metal, is formed inside the base 10, and extends on the back surface 12 similarly, although illustration thereof is not provided. The via conductor 17 is provided with a structure where a metal particle(s) is/are sintered via a neck and/or a grain boundary.

Furthermore, in a case where aluminum nitride is used for the base 10 and the dam part 20, it is preferable that a metal material where tungsten (W), molybdenum (Mo), and an alloy thereof, copper, or the like is combined therewith is used for a metallized film that is used for the terminals for element 15, 16 and/or the via conductor 17. Thereby, it is possible to fire the base 10 and the dam part 20, and the terminals for element 15, 16 and/or the via conductor 17 simultaneously.

In an embodiment, it is preferable that such a via conductor 17 is provided at a position that is closer to the second wall member 22 than the first wall member 21. Furthermore, in a case where a plurality of via conductors 17 are provided, it is preferable that more of them are provided at positions that are closer to the second wall member 22 than the first wall member 21.

Thereby, in a case where a thermal conductivity of the via conductor 17 is higher than that of the base 10, it is possible to transfer heat to the via conductor 17 more efficiently, at a site on a side of the second wall member 22 with a large thickness and a high thermal resistance between the front surface 11 where the light-emitting element 30 is mounted and the back surface 12 that has a function of releasing heat to an exterior.

Furthermore, in a case where a thermal conductivity of the via conductor 17 is lower than that of the base 10, it is possible for the via conductor 17 to balance a total thermal conductivity of a site on a side of the second wall member 22 with a large thickness and a low thermal resistance and a site on a side of the first wall member 21 with a small thickness and a relatively high thermal resistance.

Additionally, it is preferable that the via conductor 17 is arranged on a side that is close to the second wall member 22, and it is more preferable that it is arranged at a corner part of the base 10 that contacts such a second wall member 22. Additionally, in such a case, it is preferable that the via conductor 17 is absent on a side of the first wall member 21. It is preferable that a diameter of the via conductor 17 is 200 μm or less, and preferably 30 to 100 μm or less, in that it is possible to decrease a volume fraction of the via conductor 17.

Furthermore, as illustrated in FIG. 2 or the like, an outer wall surface 22*a* of the second wall member 22 and another side surface 14 of the base 10 are flush, and a side surface 6 of the substrate for mounting a light-emitting element 1 is composed of the outer wall surface 22*a* of the second wall member 22 and the side surface 14 of the base 10.

Then, in an embodiment, it is preferable that such a side surface 6 is parallel to a side surface 5 on an opposite side thereof. That is, it is preferable that the side surface 13 and the side surface 14 of the base 10 are parallel and the outer wall surface 21*a* and the outer wall surface 22*a* of the dam part 20 are parallel.

Figure 3:
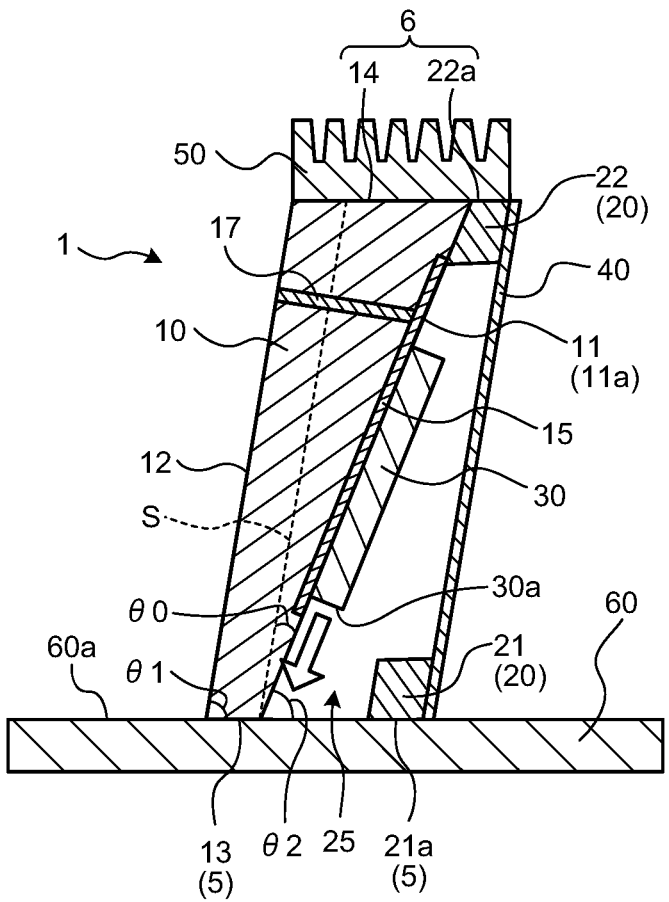
FIG. 3 is a diagram for explaining a state where a substrate for mounting a light-emitting element according to an embodiment is used.

Thereby, as illustrated in FIG. 3, in a case where the side surface 5 is provided so as to contact a surface 60*a* of the substrate 60 and the side surface 6 is provided with a heat sink 50, it is possible to place such a heat sink 50 so as to be parallel to the substrate 60.

That is, even if a heavy object such as the heat sink 50 is provided on the side surface 6, it is possible to stably arrange such a heavy object so as to be parallel to the surface 60*a* of the substrate 60 for silicon photonics.

Accordingly, even in a case where the light-emitting element 30 is driven so that the substrate for mounting a light-emitting element 1 produces heat so as to cause a change of a dimension thereof, it is possible to decrease a change of a position of a center of gravity in the substrate for mounting a light-emitting element 1. Therefore, according to an embodiment, it is possible to decrease a change of an angle of radiation from the light-emitting element 30.

Additionally, "the outer wall surface 21*a* of the first wall member 21 and the outer wall surface 22*a* of the second wall member 22 that are parallel" are not limited to a case where a whole surface of the outer wall surface 21*a* of the first wall member 21 and a whole surface of the outer wall surface 22*a* of the second wall member 22 are parallel, and also includes a case where a partial region of the outer wall surface 21*a* of the first wall member 21 and a partial region of the outer wall surface 22*a* of the second wall member 22 are parallel.

Herein, it is sufficient that a "partial region" is of 50% or more of the outer wall surface 21*a*, 22*a* where a partial region of the outer wall surface 21*a* also includes a surface area of the opening part 25.

Furthermore, it is preferable that a part that is parallel to the second wall member 22 in the first wall member 21 that has the opening part 25 is a region that is centered at the opening part 25. Moreover, it is sufficient that a parallel part on a side of the second wall member 22 is parallel to a part that corresponds to a region where the opening part 25 is formed, in a case where the first wall member 21 is parallel translated to a side of the second wall member 22.

As illustrated in FIG. 3, the front surface 11 of the base 10 is inclined relative to the surface 60*a* of the substrate (that is, the outer wall surface 21*a* and the side surface 13) at a predetermined angle $\theta 2$. A value of such an angle is obtained from formula (1) as described below.

$$\theta 2 = \theta 1 - \theta 0 \quad (1)$$

Then, in an embodiment, it is sufficient that an angle $\theta 0$ and an angle $\theta 1$ satisfy formulas (2) and (3) as described below.

$$\theta 0 = 12° \pm \delta\theta \quad (2)$$

$$\theta 1 = 90° \pm \delta\theta \quad (3)$$

Herein, in formulas (2) and (3), "±" is provided in a relation of a double sign in same order. That is, it is preferable that a shape is provided in such a manner that, in a case where the front surface 11 is changed by $\pm\delta\theta$ from an angle of 12° relative to the back surface 12, an angle $\theta 1$ between the back surface 12 and the outer wall surface 21*a* is changed by an angle of $90° \pm \delta\theta$. That is, in an embodiment, it is preferable that a shape is provided in such a manner that a shift amount $\delta\theta$ of an angle $\theta 1$ of the outer wall surface 21*a* relative to the back surface 12 is linked to a shift amount $\delta\theta$ of an angle $\theta 0$ of the front surface 11 relative to the back surface 12.

Thereby, even in a case where the front surface 11 is changed by $\pm\delta\theta$ from an angle of 12° relative to the back surface 12, it is possible to decrease a shift of an incidence angle (that is, an angle $\theta 2$) of light from the light-emitting element 30 relative to the surface 60*a* of the substrate 60.

A shift amount $\delta\theta$ may be a positive angle that provides an angle $\theta 1$ between the outer wall surface 21*a* of the first wall member 21 and the back surface 12 of the base 10 as being greater than 90° or may be a negative angle that provides an angle $\theta 1$ between the outer wall surface 21*a* of the first wall member 21 and the back surface 12 of the base 10 as being less than 90°. Furthermore, it is preferable that an absolute value of a shift amount $\delta\theta$ is 1° or less.

Furthermore, it is preferable that a predetermined angle $\theta 0$ is 5° or greater and 15° or less, and preferably, 10° or greater and 13° or less, for example, in a case where the substrate for mounting a light-emitting element 1 that composes a light-emitting device for silicon photonics is provided.

The light-emitting element 30, a lid body 40, and the heat sink 50 as illustrated in FIG. 3 are provided on the substrate for mounting a light-emitting element 1 as has already been explained, so as to compose a light-emitting device.

For the light-emitting element 30, it is possible to use, for example, a laser diode (that is also referred to as a semiconductor laser), a light-emitting diode (LED: Light Emitting Diode), and/or the like. The substrate for mounting a light-emitting element 1 according to an embodiment is useful as, particularly, a substrate for laser diode.

The light-emitting element 30 is arranged in such a manner that the light-emitting surface 30*a* that is provided on an end surface thereof faces the opening part 25 of the substrate for mounting a light-emitting element 1. The light-emitting element 30 is bonded to the terminal for element 15 on the mounting part 11*a* by using an electrically conductive bonding material such as solder. Herein, a (non-illustrated) first electrode that is provided on a lower surface of the light-emitting element 30 and the terminal for element 15 are electrically connected by such an electrically conductive bonding material.

Moreover, a (non-illustrated) second electrode that is provided on an upper surface of the light-emitting element 30 and the terminal for element 16 that is adjacent to the terminal for element 15 are electrically connected by using a (non-illustrated) bonding wire or the like.

Additionally, it is preferable that the front surface 11 that includes the mounting part 11*a* where the terminals for element 15, 16 are provided is a flat surface. On the other hand, if it is possible to ensure a state where a first electrode of the light-emitting element 30 contacts the terminal for element 15, the front surface 11 that includes the mounting part 11*a* may convexly be curved toward a space part that is positioned above such a front surface 11.

In a case where the front surface 11 that includes the mounting part 11*a* is convexly curved toward a space part that is positioned above such a front surface 11, it is possible to suppress diffuse reflecting of light that is emitted from the light-emitting element 30 from the front surface 11, so that it is possible to suppress decreasing of an efficiency of light emission of a light-emitting device.

The lid body 40 is a member for sealing a region of the light-emitting element 30 or the like that is surrounded by the dam part 20. The lid body 40 is bonded to an upper surface of the dam part 20 via a metal member such as a metallized film and/or a plated film.

For a material of the lid body 40, a ceramic(s) (for example, aluminum nitride) or a metal (for example, Kovar (an Fe—Ni—Co alloy)), or a composite member of a ceramic(s) and a metal is/are preferable from a viewpoint of a high thermal conductivity.

A non-illustrated optical waveguide is formed on the substrate 60 for silicon photonics. Then, light that is emitted from the light-emitting element 30 of a light-emitting device travels in such an optical waveguide while reflecting (refracting) at an interface between a core and a clad thereof, so that it is preferable that light that is emitted from the light-emitting element 30 is incident on the optical waveguide in an oblique direction relative to an extension direction thereof.

Herein, in the substrate for mounting a light-emitting element 1 according to an embodiment, it is possible to arrange the light-emitting element 30 so as to be inclined relative to the substrate 60, so that it is possible to cause light to be stably incident on an optical waveguide in an oblique direction relative to an extension direction thereof.

Array Substrate

Figure 4:
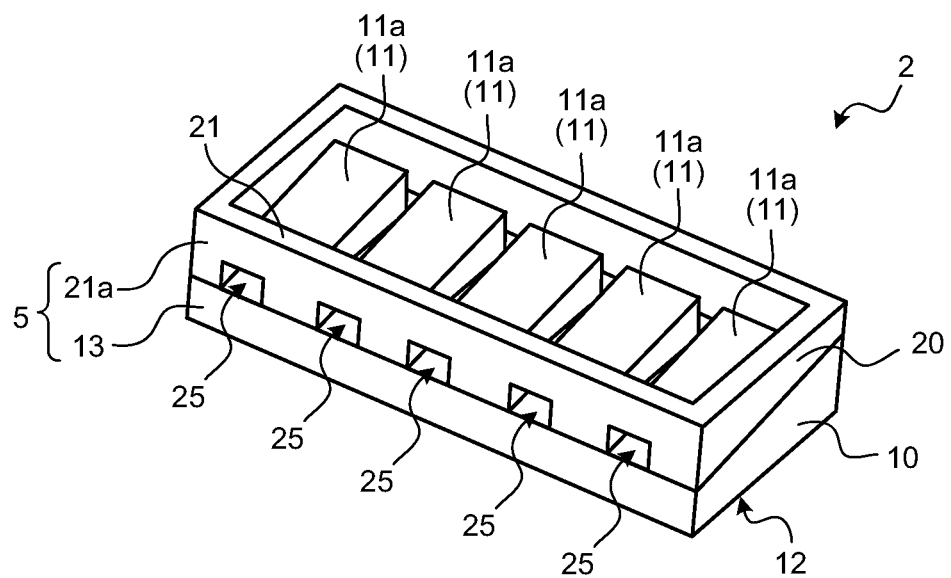
FIG. 4 is a perspective view of an array substrate according to an embodiment.

Next, an array substrate 2 according to an embodiment will be explained by using FIG. 4. As illustrated in FIG. 4, the array substrate 2 according to an embodiment has a structure where a plurality of substrates for mounting a light-emitting element 1 as described above are joined.

That is, the array substrate 2 has a base 10 and a dam part 20 that are of a rectangular shape. Then, the base 10 is provided with a plurality of (five in FIG. 4) mounting parts 11*a* that are capable of mounting light-emitting elements 30 (see FIG. 2) thereon. Furthermore, the dam part 20 is provided so as to surround the plurality of mounting parts 11*a* and a plurality of (five in FIG. 4) opening parts 25 that correspond to respective mounting parts 11*a* are formed in such a dam part 20.

Also in a case of the array substrate 2, similarly to the substrate for mounting a light-emitting element 1, it is preferable that an angle θ0 of a front surface 11 relative to a back surface 12 (see FIG. 2), an angle θ1 between an outer wall surface 21*a* of a first wall member 21 and the back surface 12 of the base 10 (see FIG. 2), and a shift amount of an angle δθ from the angle θ0 are similar to those of the substrate for mounting a light-emitting element 1 as described above.

In the array substrate 2 according to an embodiment, the first wall member 21 where all of the opening parts 25 are formed is inclined relative to the back surface 12 in a direction that is identical to that of the front surface 11, so that it is possible to further increase opening angles of the opening parts 25 for light-emitting surfaces 30*a* (see FIG. 2) of all of the light-emitting elements 30. Thereby, it is possible to decrease a proportion of light that impinges on the opening parts 25 in one that is radiated from all of the light-emitting surfaces 30*a*.

Therefore, according to an embodiment, in a case where a plurality of optical waveguides that are formed on a substrate 60 (see FIG. 3) are irradiated with light from the plurality of light-emitting elements 30, it is possible to increase a degree of accuracy of a refraction mode of light in such a plurality of optical waveguides, so that it is possible to decrease a transmission loss on a light path.

Manufacturing Method for Substrate for Mounting Light-Emitting Element

Next, a manufacturing method for a substrate for mounting a light-emitting element 1 according to an embodiment will be explained with reference to FIG. 5 to FIG. 10. The substrate for mounting a light-emitting element 1 is formed by applying a predetermined process to each of two green sheets, subsequently laminating the two green sheets, and finally firing a laminated molded body.

Hereinafter, each process in a first half for a green sheet 70 for an upper layer among two green sheets will be explained based on FIG. 5 and FIG. 6 and each process in a first half for a green sheet 80 for a lower layer will be explained based on FIG. 7 to FIG. 9. Finally, each process in a second half for the green sheet 70, 80 will be explained based on FIG. 10.

Figure 5A:
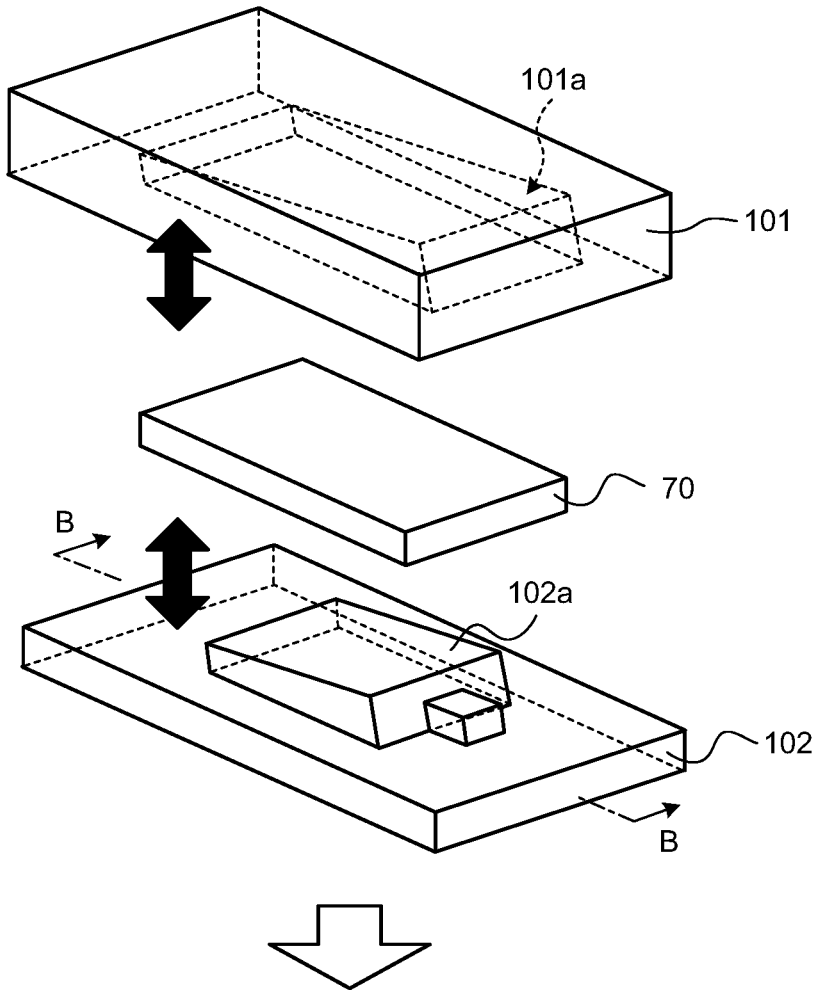
FIGS. 5A and 5B are a perspective view that illustrate a manufacturing process for a substrate for mounting a light-emitting element according to an embodiment.
Figure 5B:
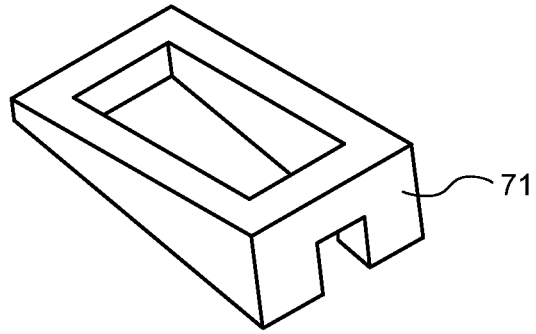
Figures 6A, 6B:
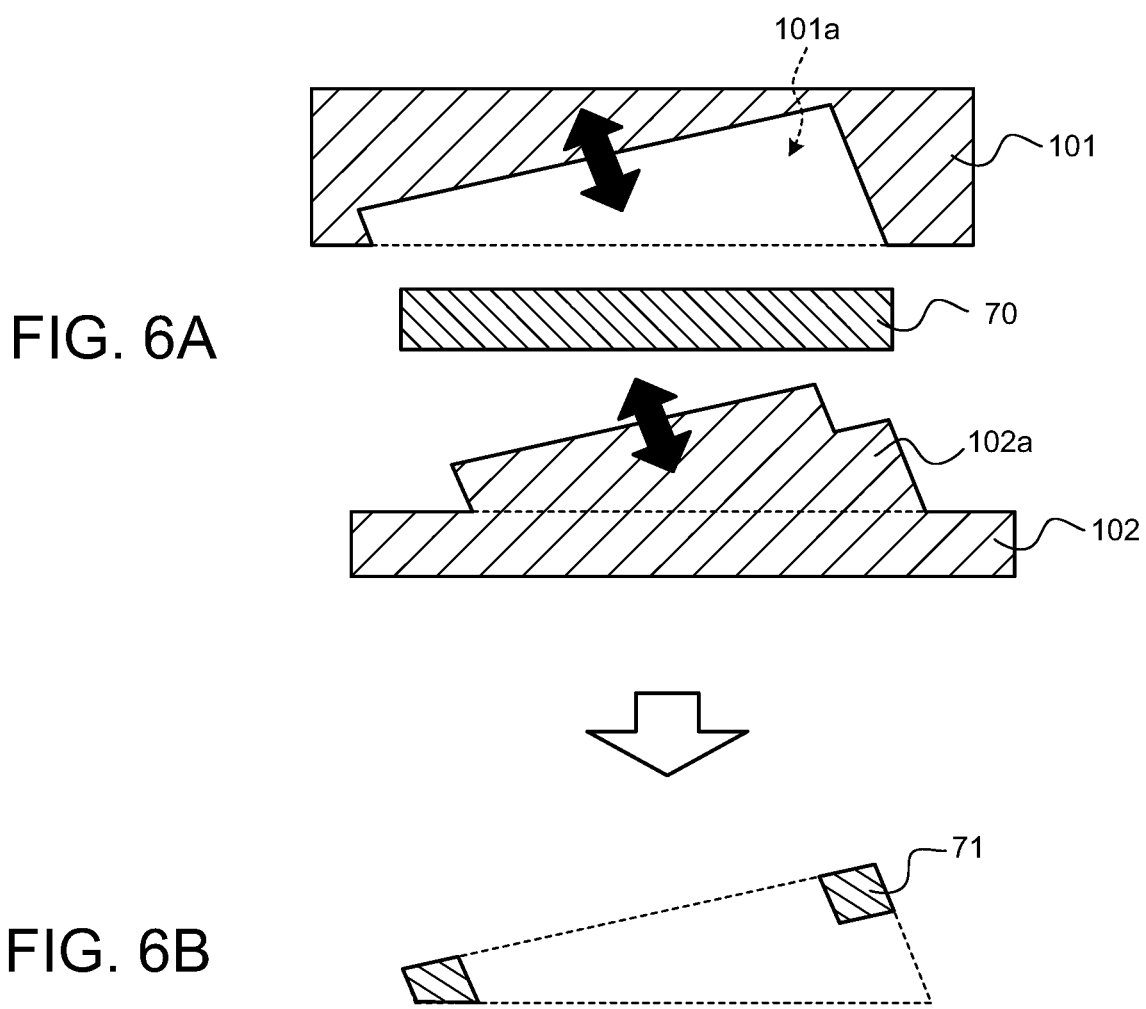
FIGS. 6A and 6B are an arrow cross-sectional view along line B-B as illustrated in FIG. 5.

As illustrated in (a) of FIG. 5 and (a) of FIG. 6, a green sheet 70 that is preliminarily processed into a predetermined shape is prepared. Then, pressurizing and heating are executed for the green sheet 70 in such a manner that it is interposed between an upper die 101 where a predetermined recess part 101*a* is formed and a lower die 102 where a predetermined protrusion part 102*a* is formed, so that a dam part molded body 71 is formed ((b) of FIG. 5 and (b) of FIG. 6).

Herein, the recess part 101*a* that is formed on the upper die 101 has a shape that corresponds to an outer wall of a dam part 20 and the protrusion part 102*a* that is formed on the lower die 102 has a shape that corresponds to an inner wall of the dam part 20 and an opening part 25. Thereby, as illustrated in (b) of FIG. 5, the dam part molded body 71 has a shape that is similar to that of the dam part 20.

Additionally, when the green sheet 70 is pressurized and heated, it is preferable that the upper die 101 and the lower die 102 are pressurized along an oblique direction relative to a principal surface of the green sheet 70, as illustrated in (a) of FIG. 6.

Furthermore, in a case where an angle θ0 as described above is shifted from a target angle θ0 in the formed dam part molded body 71, it is preferable that an angle θ2 as described above is finely adjusted by applying a grinding process or the like thereto after molding thereof. Thereby, it is possible to provide an angle θ1 between an outer wall surface 21*a* of a first wall member 21 and a back surface 12 as it is preferable that a shape is provided in such a manner that an angle that is positively or negatively shifted from a right angle.

Figure 7A:
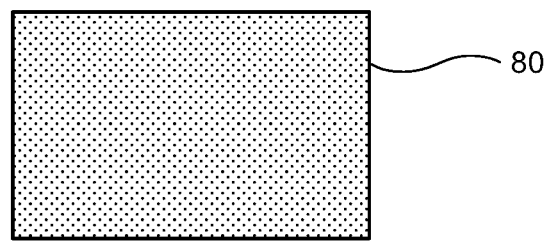
FIGS. 7A, 7B, and 7C are a plan view that illustrate a manufacturing process for a substrate for mounting a light-emitting element according to an embodiment.
Figure 7B:
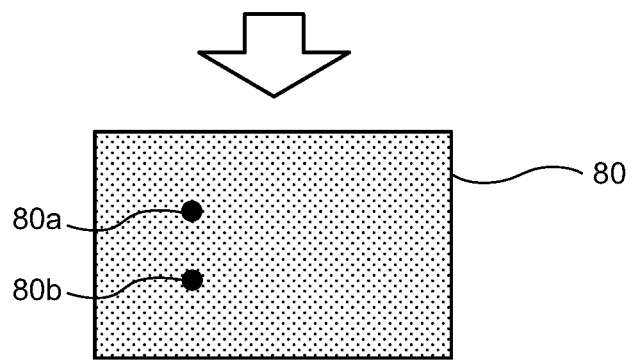
Figure 7C:
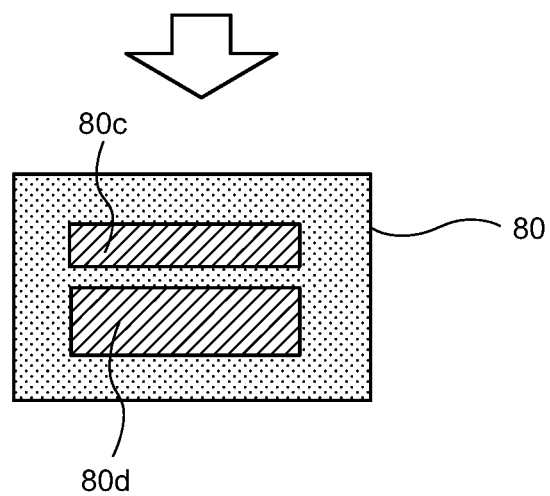

Then, as illustrated in (a) of FIG. 7, a green sheet 80 that is preliminarily processed into a predetermined shape is prepared. Then, the green sheet 80 is punched so as to provide circular shapes at two predetermined places in a plan view thereof and two hole parts provided by punching are filled with via conductors 80*a*, 80*b*, respectively ((b) of FIG. 7).

Then, as illustrated in (c) of FIG. 7, a conductor pattern 80*c* is printed on an upper surface of the green sheet 80 so as to lead to the via conductor 80*a* and a conductor pattern 80*d* is printed thereon so as to lead to the via conductor 80*b*.

Figure 8A:
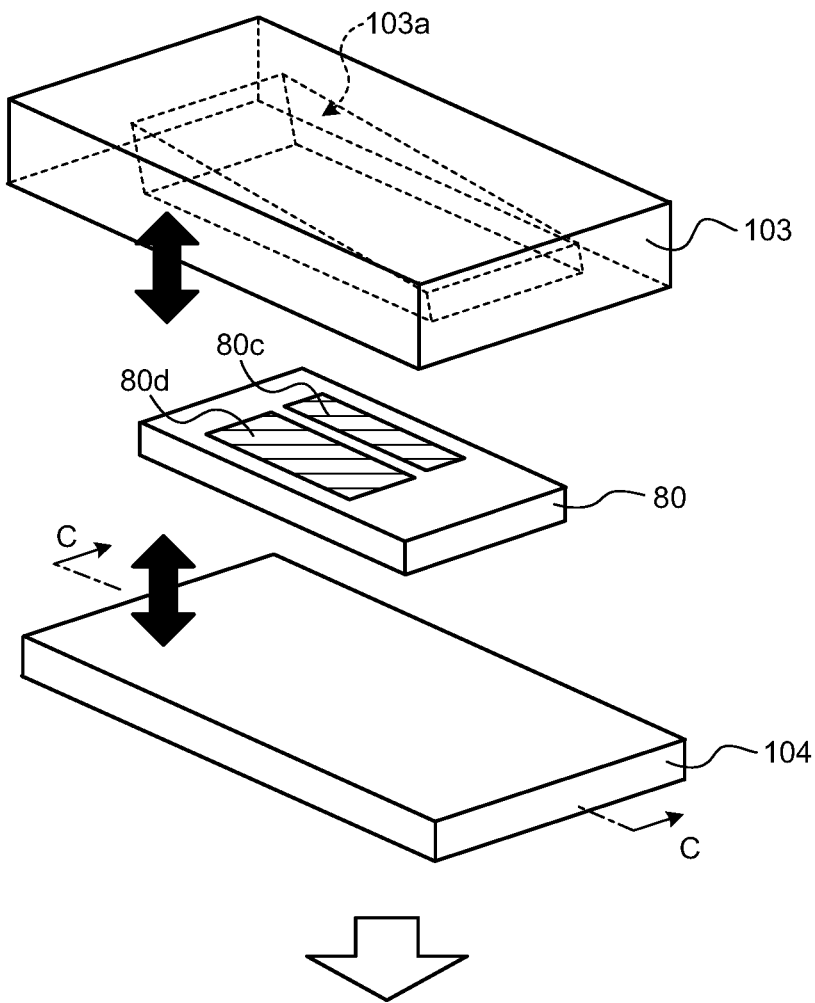
FIGS. 8A and 8B are a perspective view that illustrate a manufacturing process for a substrate for mounting a light-emitting element according to an embodiment.
Figure 8B:
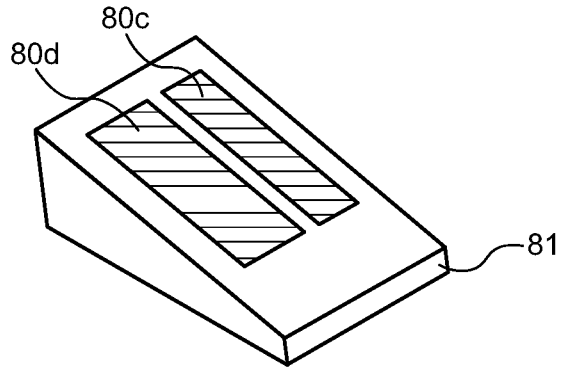
Figure 9A:
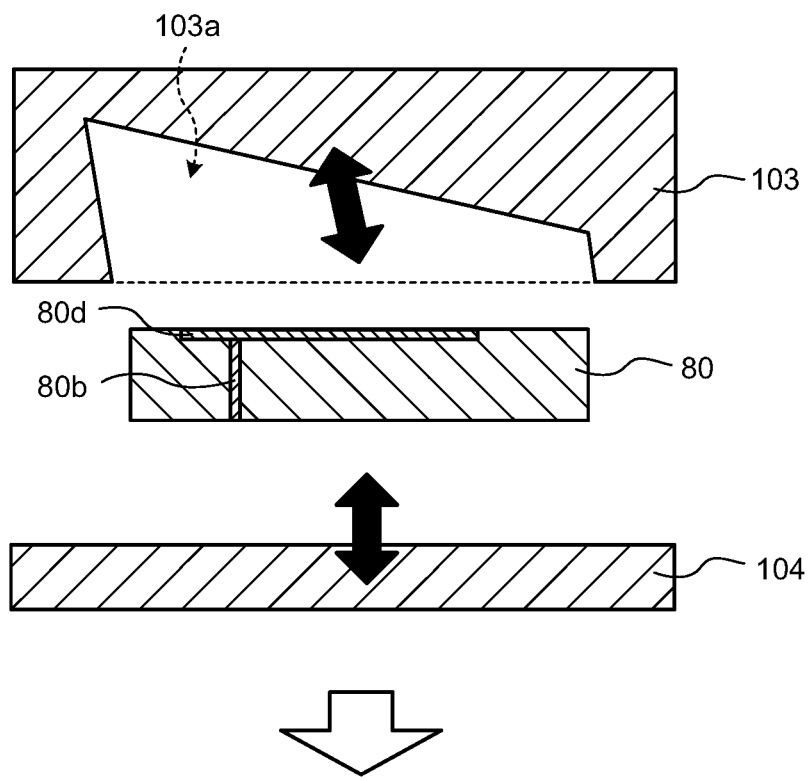
FIGS. 9A and 9B are an arrow cross-sectional view along line C-C as illustrated in FIG. 8.
Figure 9B:
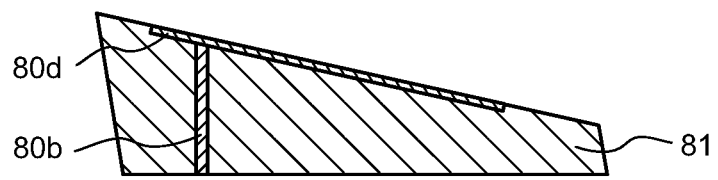

Then, as illustrated in (a) of FIG. 8 and (a) of FIG. 9, pressurizing and heating are executed for the green sheet 80 in such a manner that it is interposed between an upper die 103 where a predetermined recess part 103*a* is formed and a lower die 104 with a flat plate shape, so that a base molded body 81 is formed ((b) of FIG. 8 and (b) of FIG. 9).

Herein, the recess part 103*a* that is formed on the upper die 103 has a shape that corresponds to an outline of a base 10. Thereby, as illustrated in (b) of FIG. 8, the base molded body 81 has a shape that is similar to that of the base 10.

Furthermore, in a case where an angle θ0 as described above is shifted from a target angle θ0 in the formed base molded body 81, it is preferable that an angle θ1 as described above is finely adjusted by applying a grinding process or the like thereto after molding thereof. Thereby, it is possible to provide an angle θ1 between the outer wall surface 21*a* of the first wall member 21 and the back surface 12 as an angle that is positively or negatively shifted from a right angle.

Additionally, when the green sheet 80 is pressurized and heated, it is preferable that the upper die 103 is pressurized along an oblique direction relative to a principal surface of the green sheet 80, as illustrated in (a) of FIG. 9.

Figure 10A:
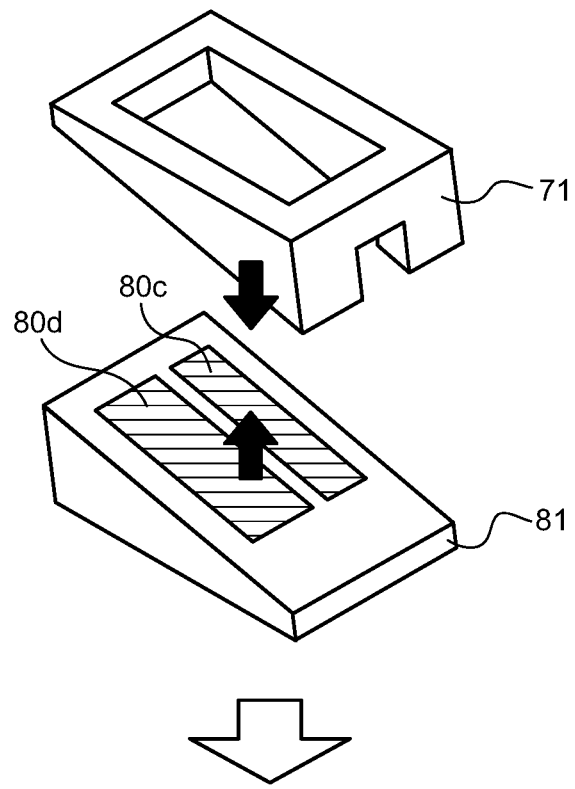
FIGS. 10A and 10B are a perspective view that illustrate a manufacturing process for a substrate for mounting a light-emitting element according to an embodiment.
Figure 10B:
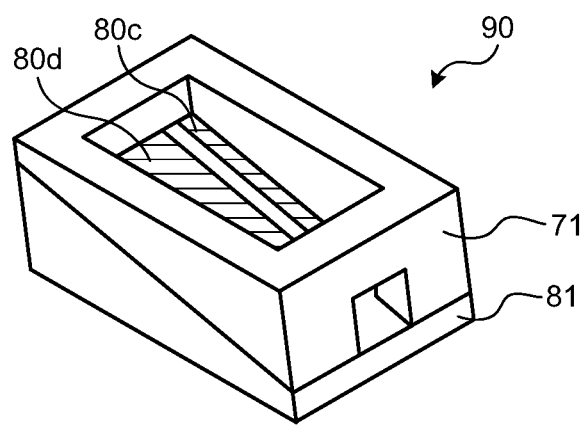

Then, as illustrated in (a) of FIG. 10, the dam part molded body 71 and the base molded body 81 are laminated in order from above. Then, heating and pressurizating are executed for such a laminated body so as to form a lamination molded body 90 ((b) of FIG. 10).

Herein, the conductor patterns 80c, 80d are sites that correspond to terminals for element 16, 15 of the substrate for mounting a light-emitting element 1, respectively, and the via conductors 80a, 80b are sites that correspond to a via conductor that is connected to the terminal for element 16 of the substrate for mounting a light-emitting element 1 and a via conductor 17 that is connected to the terminal for element 15 thereof, respectively.

Then, at an end of such a manufacturing process, the lamination molded body 90 that is formed like (b) of FIG. 10 is fired at a high temperature (1500° C. to 1900° C.), so that the substrate for mounting a light-emitting element 1 is completed.

For the green sheets 70, 80 that are used for a manufacturing process as described above, for example, an inorganic powder where a powder that is composed of yttria ($Y_2O_3$), calcia (CaO), erbia ($Er_2O_3$), or the like as a sintering aid is mixed to a powder of aluminum nitride that is a main raw material is provided as a basic component thereof. Then, an organic vehicle is added and mixed into such an inorganic powder so as to provide a slurry form and a conventionally well-known doctor blade method or calendar roll method is used for it, so that the green sheets 70, 80 are formed.

Furthermore, the via conductors 80a, 80b and/or the conductor patterns 80c, 80d are formed by, for example, a paste where aluminum nitride, an organic binder, a solvent, or the like as a co-agent is mixed into molybdenum (Mo) and/or tungsten (W) as a high-melting-point metal(s) that is/are a main raw material(s). Additionally, a high-melting-point metal as described above that includes a low-melting-point metal such as copper may be used depending on a firing temperature of a ceramic(s).

Furthermore, it is also possible to fabricate an array substrate 2 as described above similarly by changing shapes or the like of the upper dies 101, 103 and the lower dies 102, 104.

PRACTICAL EXAMPLES

Hereinafter, a substrate for mounting a light-emitting element 1 according to an embodiment or the like was fabricated specifically, and then, a light-emitting device where such a substrate for mounting a light-emitting element 1 or the like was applied was fabricated.

First, a mixed powder with a proportion where 5% by mass of an yttria powder and 1% by mass of a calcia powder were mixed to 94% by mass of an aluminum nitride powder was prepared as a mixed powder for forming a green sheet.

Then, 20 parts by mass of an acrylic binder as an organic binder and 50 parts by mass of toluene were added to 100 parts by mass of such a mixed powder (a solid content) so as to prepare a slurry, and then, a green sheet with an average thickness of 500 μm was fabricated by using a doctor blade method.

Furthermore, a conductor paste where 20 parts by mass of an aluminum nitride powder, 8 parts by mass of an acrylic binder, and terpineol were appropriately added to 100 parts by mass of a tungsten powder was used for formation of a conductor such as a conductor pattern or a via conductor. Furthermore, a conductor paste where 0.5% by mass of a thixotropic agent was further added to such a conductor paste and a conductor paste where 1.0% by mass of a thixotropic agent was further added to such a conductor paste, other than such a conductor paste, were also used.

Then, a lamination molded body 90 (see (b) of FIG. 10) was fabricated by using the green sheet and the conductor paste that had components as described above in accordance with a manufacturing method as illustrated in FIG. 5 to FIG. 10.

Then, firing of the fabricated lamination molded body 90 was executed in a reducing atmosphere for 2 hours on a condition that a maximum temperature was 1800° C., so as to fabricate a substrate for mounting a light-emitting element 1 or the like. Additionally, a size of a fabricated package for mounting a light-emitting element A1 or the like was a width of 2.5 mm×a length of 4.2 mm×a height of 1.0 mm for a shape after firing thereof. The number of samples was each 10 and an average value thereof is illustrated in Table 1.

Then, a light-emitting element 30 was packaged on a mounting part 11a of the substrate for mounting a light-emitting element 1 or the like. Herein, a semiconductor laser element with an oscillation wavelength of 1080 nm and an output of 3 W (a width of 0.3 mm×a length of 1.8 mm×a height of 0.15 mm) was used as the light-emitting element 30 and an Au—Sn solder was used for bonding of the light-emitting element 30 to the mounting part 11a.

Figure 11:
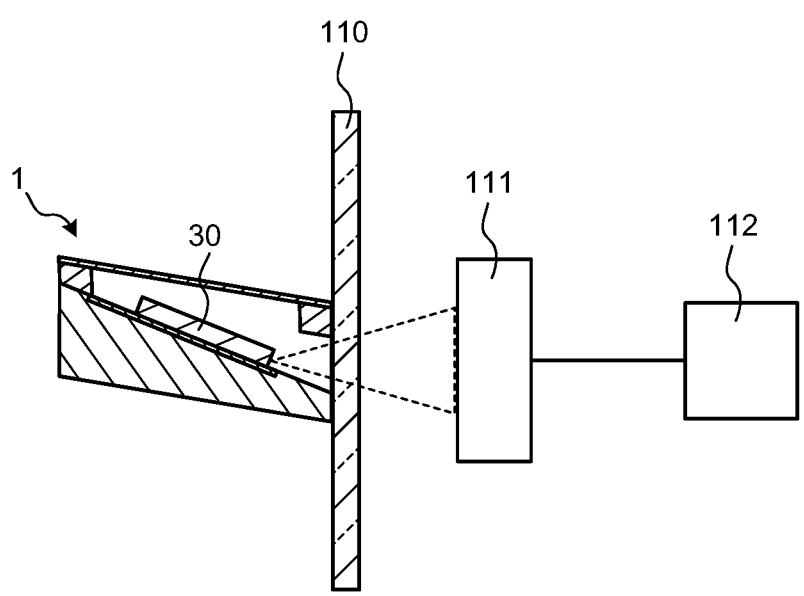
FIG. 11 is a conceptual diagram that illustrates an evaluation device for a degree of accuracy of an optical axis in a substrate for mounting a light-emitting element according to an embodiment.

Then, a degree of accuracy of an optical axis of the substrate for mounting a light-emitting element 1 or the like was evaluated. Such a degree of accuracy of an optical axis was evaluated by using an evaluation device as illustrated in FIG. 11. Specifically, the substrate for mounting a light-emitting element 1 or the like was packaged on a transparent substrate 110 and a degree of accuracy of an optical axis thereof was evaluated based on radiation light that was radiated to a light receiver 111 that was 3 mm distant from the light-emitting element 30.

Additionally, a received light intensity distribution of radiation light that was radiated to the light receiver 111 or the like was evaluated by a PC (Personal Computer) 112 that was connected to such a light receiver 111. Evaluation results are illustrated in Table 1. Additionally, a shift amount as illustrated in Table 1 is a relative value in a case where zero is provided for sample 1.

TABLE 1

|  | θ0 (°) | θ1 (°) | θ2 (°) | Shift amount (mm) |
|---|---|---|---|---|
| Sample 1 | 12 | 90 | 78 | 0 |
| Sample 2 | 13 | 91 | 78 | 0.005 |
| Sample 3 | 11 | 89 | 78 | 0.005 |
| Sample 4 | 13 | 90 | 77 | 0.05 |

It is found that a degree of accuracy of an optical axis is improved by providing an angle θ2=78°, from comparison between a light-emitting device for sample 4 where angles θ0=13°, θ1=90°, and θ2=77° are provided and light-emitting devices for sample 1 where angles θ0=12°, θ1=90°, and θ2=78° are provided, sample 2 where angles θ0=13°, θ1=91°, and θ2=78° are provided, and sample 3 where angles θ0=11°, θ1=89°, and θ2=78° are provided.

Additionally, although only constant values as average values as described above are illustrated as angles θ0, θ1, and θ2 in Table 1, any of samples where angles θ0, θ1, and θ2 fell within a range of −0.5° to +0.5°, among a plurality of fabricated samples, for samples 2 and 3, provided a value that was identical to a shift amount as illustrated in Table 1.

Although an embodiment(s) of the present invention has/have been explained above, the present invention is not limited to the embodiment(s) as described above and a variety of modifications are possible without departing from a spirit thereof. For example, although an example where a light-emitting device is provided where the substrate for mounting a light-emitting element 1 is applied to the substrate 60 for silicon photonics has been illustrated in the embodiment(s) as described above, a light-emitting device where the substrate for mounting a light-emitting element 1 is applied may be provided on a substrate other than that for silicon photonics.

As described above, a substrate for mounting a light-emitting element 1 according to an embodiment includes a base 10 that has a front surface 11 and a back surface 12 that are principal surfaces thereof where the front surface 11 has a mounting part 11*a* that is capable of mounting a light-emitting element 30 thereon, and a dam part 20 that is arranged on a peripheral part 11*b* of the front surface 11 so as to surround the mounting part 11*a*. The front surface 11 is inclined relative to the back surface 12 at a predetermined angle θ0. The dam part 20 is provided with an opening part 25 at a site (a first wall member 21) with a thickness that is decreased by inclination of the base 10. A site (the first wall member 21) of the dam part 20 where the opening part 25 is provided is inclined relative to the back surface 12 in a direction that is identical to that of the front surface 11. Thereby, in a case where an optical waveguide that is formed on a substrate 60 is irradiated with light from a light-emitting element 30, it is possible to increase a degree of accuracy of a refraction mode of light in such an optical waveguide, so that it is possible to decrease a transmission loss on a light path.

Furthermore, in the substrate for mounting a light-emitting element 1 according to an embodiment, an inner surface 25*b* that leads to the front surface 11 in an inner surface of the opening part 25 is flush with the front surface 11. Thereby, it is possible to maintain a high efficiency of light emission in a light-emitting device.

Furthermore, in the substrate for mounting a light-emitting element 1 according to an embodiment, the base 10 is of a rectangular shape in a plan view thereof, the dam part 20 has four wall members that are arranged along four sides of the base 10, and a first wall member 21 where the opening part 25 is formed, among the four wall members, is inclined relative to the back surface 12 in a direction that is identical to that of the front surface 11. Thereby, it is possible to increase an efficiency of light emission of a light-emitting device.

Furthermore, in the substrate for mounting a light-emitting element 1 according to an embodiment, a height of the first wall member 21 is greater than that of a second wall member 22 that is a wall member that faces such a first wall member 21. Thereby, it is possible to increase an efficiency of light emission of a light-emitting device.

Furthermore, in the substrate for mounting a light-emitting element 1 according to an embodiment, an outer wall surface 21*a* of the first wall member 21 is parallel to an outer wall surface 21*b* of the second wall member 22. Thereby, it is possible to decrease a change of an angle of radiation from a light-emitting element 30.

Furthermore, in the substrate for mounting a light-emitting element 1 according to an embodiment, an angle θ0 of the back surface 12 relative to the front surface 11 is 12°±δθ, and an angle θ1 of an outer wall surface 21*a* of the first wall member 21 relative to the front surface 11 is 90°±δθ. Thereby, even in a case where a front surface 11 is changed from an angle of 12° relative to a back surface 12 by ±δθ, it is possible to decrease a shift of an incidence angle of light from a light-emitting element 30 relative to a surface 60*a* of a substrate 60.

Furthermore, in an array substrate 2 according to an embodiment, a plurality of the substrates for mounting a light-emitting element 1 as described above are joined. Thereby, in a case where a plurality of optical waveguides that are formed on a substrate 60 are irradiated with light from a plurality of light-emitting elements 30, it is possible to increase a degree of accuracy of a refraction mode of light in such a plurality of optical waveguides, so that it is possible to decrease a transmission loss on a light path.

Furthermore, a light-emitting device according to an embodiment includes the substrate for mounting a light-emitting element 1 or the array substrate 2 as described above, and a light-emitting element(s) 30 that is/are mounted on the mounting part(s) 11*a* of the substrate for mounting a light-emitting element 1 or the array substrate 2. Thereby, in a case where an optical waveguide(s) that is/are formed on a substrate 60 is/are irradiated with light from a light-emitting element(s) 30, it is possible to increase a degree of accuracy of a refraction mode of light in such an optical waveguide(s), so that it is possible to decrease a transmission loss on a light path.

It is possible for a person(s) skilled in the art to readily derive an additional effect(s) and/or another/other aspect(s). Hence, a broader aspect(s) of the present invention is/are not limited to a specific detail(s) and a representative embodiment(s) as illustrated and described above. Therefore, various modifications are possible without departing from a spirit or scope of a general inventive concept that is defined by the appended claim(s) and an equivalent(s) thereof.

REFERENCE SIGNS LIST

1 substrate for mounting a light-emitting element
2 array substrate
10 base
11 front surface
11*a* mounting part
11*b* peripheral part
12 back surface
13, 14 side surfaces
15, 16 terminals for element
20 dam part
21 first wall member
22 second wall member
25 opening part
25*b* inner surface
30 light-emitting element
30*a* light-emitting surface
40 lid body
50 heat sink
60 substrate

The invention claimed is:
1. A substrate for mounting a light-emitting element, comprising:
 a base having a front surface and a back surface that are principal surfaces thereof,
 wherein the front surface has a mounting part for mounting a light-emitting element thereon, and the front surface is inclined at a predetermined angle relative to the back surface; and
 a dam part arranged on a peripheral part of the front surface to surround the mounting part, wherein
 the dam part is provided with an opening part at a site where the front surface is inclined to decrease a thickness of the base, and an outer wall surface of the dam part where the opening part is provided is inclined relative to the back surface in a direction of the front surface, wherein
the base is a rectangular shape in a plan view,
the dam part has four wall members that are arranged along four sides of the base, and
a first wall member of the four wall members where the opening part is formed is inclined relative to the back surface in the direction of the front surface, wherein
a height of the first wall member is greater than a height of a second wall member of the four wall members that faces the first wall member.

2. The substrate for mounting a light-emitting element according to claim 1, wherein
an outer wall surface of the first wall member is parallel to an outer wall surface of the second wall member.

3. The substrate for mounting a light-emitting element according to claim 1, wherein
an inner surface of the opening part that leads to the front surface is flush with the front surface.

4. The substrate for mounting a light-emitting element according to claim 1, wherein
an angle of the back surface relative to the front surface is $12°\pm\delta\theta$,
an angle of an outer wall surface of the first wall member relative to the front surface is $90°\pm\delta\theta$, and
an absolute value of $\delta\theta$ is 1° or less.

5. An array substrate, wherein
a plurality of substrates for mounting a light-emitting element according to claim 1 are joined.

6. A light-emitting device, comprising:
the substrate for mounting a light-emitting element according to claim 1; and
a light-emitting element that is mounted on the mounting part of the substrate.

7. A light-emitting device, comprising:
the array substrate according to claim 5; and
a plurality of light-emitting elements that are mounted on a plurality of mounting parts of the array substrate.

\* \* \* \* \*